United States Patent [19]
Wu et al.

[11] Patent Number: 6,100,736
[45] Date of Patent: *Aug. 8, 2000

[54] FREQUENCY DOUBLER USING DIGITAL DELAY LOCK LOOP

[75] Inventors: Tony H. Wu, Milpitas; James C. C. Chan, Fremont; Sandy Lee, Sunnyvale; Fong-Jim Wang, Fremont, all of Calif.

[73] Assignee: Cirrus Logic, Inc, Fremont, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/869,653

[22] Filed: Jun. 5, 1997

[51] Int. Cl.[7] .................................................. H03L 7/06
[52] U.S. Cl. ........................ 327/159; 327/116; 327/150; 327/161; 331/25; 331/DIG. 2; 375/376
[58] Field of Search .................................... 327/149, 150, 327/151, 153, 156, 158, 144–148, 141, 142, 143, 155, 159, 161, 162, 116, 113, 114; 331/25, 53, DIG. 2, 1 A; 375/373–376

[56] References Cited

U.S. PATENT DOCUMENTS

| | | | |
|---|---|---|---|
| 5,055,800 | 10/1991 | Black et al. | 331/1 A |
| 5,079,519 | 1/1992 | Ashby et al. | 331/1 A |
| 5,111,066 | 5/1992 | Artieri et al. | 327/116 |
| 5,124,656 | 6/1992 | Yassa et al. | 327/155 |
| 5,230,014 | 7/1993 | Benhamida | 377/75 |
| 5,317,202 | 5/1994 | Waizman | 327/156 |
| 5,347,232 | 9/1994 | Nishimichi | 331/1 A |
| 5,355,037 | 10/1994 | Andresen et al. | 327/158 |
| 5,359,232 | 10/1994 | Eitrheim et al. | 327/116 |
| 5,422,835 | 6/1995 | Houle et al. | 708/103 |
| 5,479,125 | 12/1995 | Tran | 327/119 |
| 5,548,235 | 8/1996 | Marbot | 327/158 |
| 5,552,727 | 9/1996 | Nakao | 327/159 |
| 5,614,855 | 3/1997 | Lee et al. | 327/158 |
| 5,721,501 | 2/1998 | Toyoda et al. | 327/116 |

FOREIGN PATENT DOCUMENTS 0 613 245 A1  8/1994  European Pat. Off. .

OTHER PUBLICATIONS

Okajima, Y., et al., "Digital Delay Locked Loop and Design Technique for High Speed Synchronous Intreface", IEICE Transactions Electronics, vol. E79C, No. 6, pp. 798–807, Jun. 1, 1996.

Okajima, Y. et al., "Digital Delay Locked Loop and Design Technique for High–Speed Synchronous Interface", pp. 798–807, IENCE Trans. Electron, vol. E79–C, No. 6, Jun. 1996.

*Primary Examiner*—Timothy P. Callahan
*Assistant Examiner*—Minh Nguyen
*Attorney, Agent, or Firm*—Robert P. Bell; Peter Rutkowski; J. P. Violette

[57] ABSTRACT

A phase comparator compares phase of a clock signal and a generated comparison clock signal based upon rising edges. The output of the phase comparator may include a series of short up (U) pulses or down (D) pulses, depending whether the phase of the comparison clock is leading or lagging the clock. Up and down pulses U and D control an up/down shift register which in turn compensates phase difference by inserting or removing additional discrete delay elements in a variable delay line. Based upon delay signals generated by the variable delay line, a double frequency clock generator generates a 2× clock signal. The 2× clock signal is divided by 2 in a divider to supply the phase comparator with the generated comparison clock signal. The feedback scheme helps the digital delay lock loop of stabilize after a few clock cycles without additional external control. The use of digital delay elements in the delay lock loop eliminates the need for large analog circuits used in PLLs, and thus saves silicon (wafer) space. In addition, the digital circuitry of the present invention consumes less power than a comparable analog PLL. Moreover, the circuit of the present invention will lock at phase quickly. The digital design of the present invention may also be less sensitive to technology type (i.e., types of digital design) and thus be transitioned to future designs with less debugging and the like.

12 Claims, 15 Drawing Sheets

6,100,736

FREQUENCY DOUBLER USING DIGITAL DELAY LOCK LOOP

FIELD OF THE INVENTION

The present invention relates to a clock for use in a digital circuit. In particular, the present invention is related to a frequency doubler circuit using a digital delay lock loop.

BACKGROUND OF THE INVENTION

The Advanced Graphics Port (AGP) protocol is a design standard for a dedicated communications bus to transmit data to and from a host processor (CPU) and a graphics controller (e.g., SVGA controller or the like). The AGP is based upon the successful PCI (Peripheral Communications Interface) bus protocol, but operates at a higher clock speed (66 MHz versus 33 MHz) and is provided with additional commands for graphics applications.

In the AGP protocol, a 66 MHz input clock source is supplied. Data is transferred on the AGP bus at both the rising edges and falling edges of each clock pulse of the 66 MHz clock source. Therefor a 2× clock signal based on the input clock source is required to sample data correctly.

In the prior art, an analog Phase Locked Loop (PLL) may have been considered sufficient for such a task, however such an analog circuit may require extensive circuitry within an integrated circuit. Moreover, such analog circuits may be more sensitive to variations in the production process and may be more difficult to operate, particularly at higher operating frequencies. Moreover, such analog circuits may consume more power than digital circuits.

SUMMARY OF THE INVENTION

The present invention provides a digital delay lock loop which is more compact (in terms of integrated circuit surface area), simpler, and more reliable than a comparable analog PLL circuit.

A phase comparator compares phase of a clock signal and a generated comparison clock signal based upon rising edges. The output of the phase comparator may comprise a series of short up (U) pulses or down (D) pulses, depending whether the phase of the comparison clock is leading or lagging the clock. Up and down pulses U and D control an up/down shift register which in turn compensates phase difference by inserting or removing additional discrete delay elements in a variable delay line.

Based upon delay signals generated by the variable delay line, a double frequency clock generator generates a 2× clock signal. The 2× clock signal is divided by 2 in a divider to supply the phase comparator with the generated comparison clock signal. The feedback scheme helps the digital delay lock loop stabilize after a few clock cycles without additional external control. The use of digital delay elements in the delay lock loop eliminates the need for large analog circuits used in PLLs. In addition, the digital circuitry of the present invention consumes less power than a comparable analog PLL.

The variable delay line may comprise a plurality of delay segments, each putting out a delay signal having a phase difference from the other. A pulse generator circuit may generate pulses at the rising edge of these delay signals. The double frequency clock generator may generate rising and falling edges of the double clock signal from the pulses, thus insuring a near 50% duty cycle in the 2× clock signal.

BRIEF DESCRIPTIONS OF THE DRAWINGS

DETAILED DESCRIPTION OF THE INVENTION

The preferred embodiment of the present invention is described in detail with respect to an implementation for a graphics controller or the like implementing a AGP bus. However, it will be appreciated by one of ordinary skill in the art that the frequency doubler and digital delay lock loop circuits of the present invention, used separately or together, may be applied to other applications where clock circuits are used.

Figure 1:
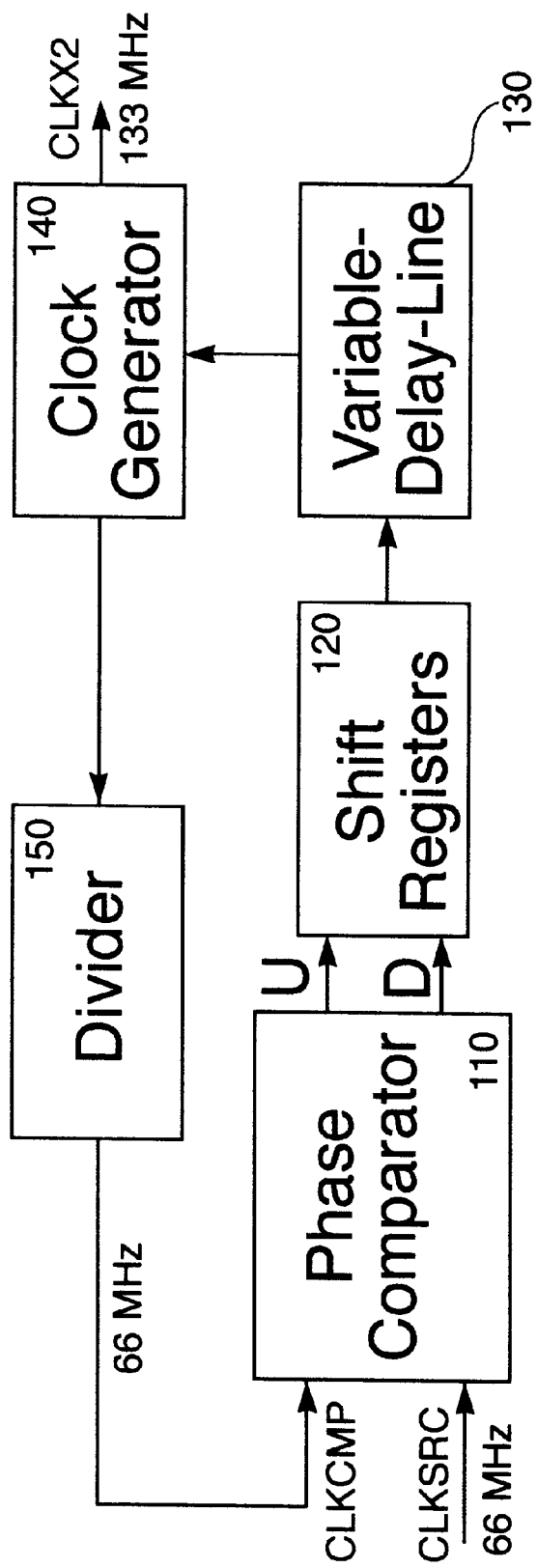
FIG. 1 is a block diagram of the digital delay lock loop of the present invention.

FIG. 1 is a block diagram of the digital delay lock loop of the present invention. Clock signal CLKSRC comprises the system interface clock running at 66 MHz. The apparatus of FIG. 1 may also support clock frequencies from 60 to 75 Mhz, or may be optimized for other ranges of frequencies.

Phase comparator 110 compares phase of clock signal CLKSRC and a generated comparison clock signal CLKCMP based upon rising edges. The output of phase comparator 110 may comprise a series of short up pulses U and/or down pulses D, depending whether phase of clock signal CLKSRC is leading or lagging generated comparison clock signal CLKCMP. Up and down pulses U and D control up/down shift registers 120 to compensate phase difference by inserting or removing additional discrete delay elements in variable delay line 130.

Based upon delay signals generated by variable delay line 130, double frequency clock generator 140 generates 2× clock signal CLKX2 and a complementary signal (not shown). In the preferred embodiment, 2x clock signal CLKX2 is twice the 66 MHz clock signal CLKSRC, or approximately 133 MHz. 2x clock signal CLKX2 is divided by 2 in divider 150 to supply phase comparator 110 with the generated comparison signal CLKCMP. The feedback scheme helps the digital delay lock loop of FIG. 1 stabilize after a few clock cycles without additional external control.

Figure 2:
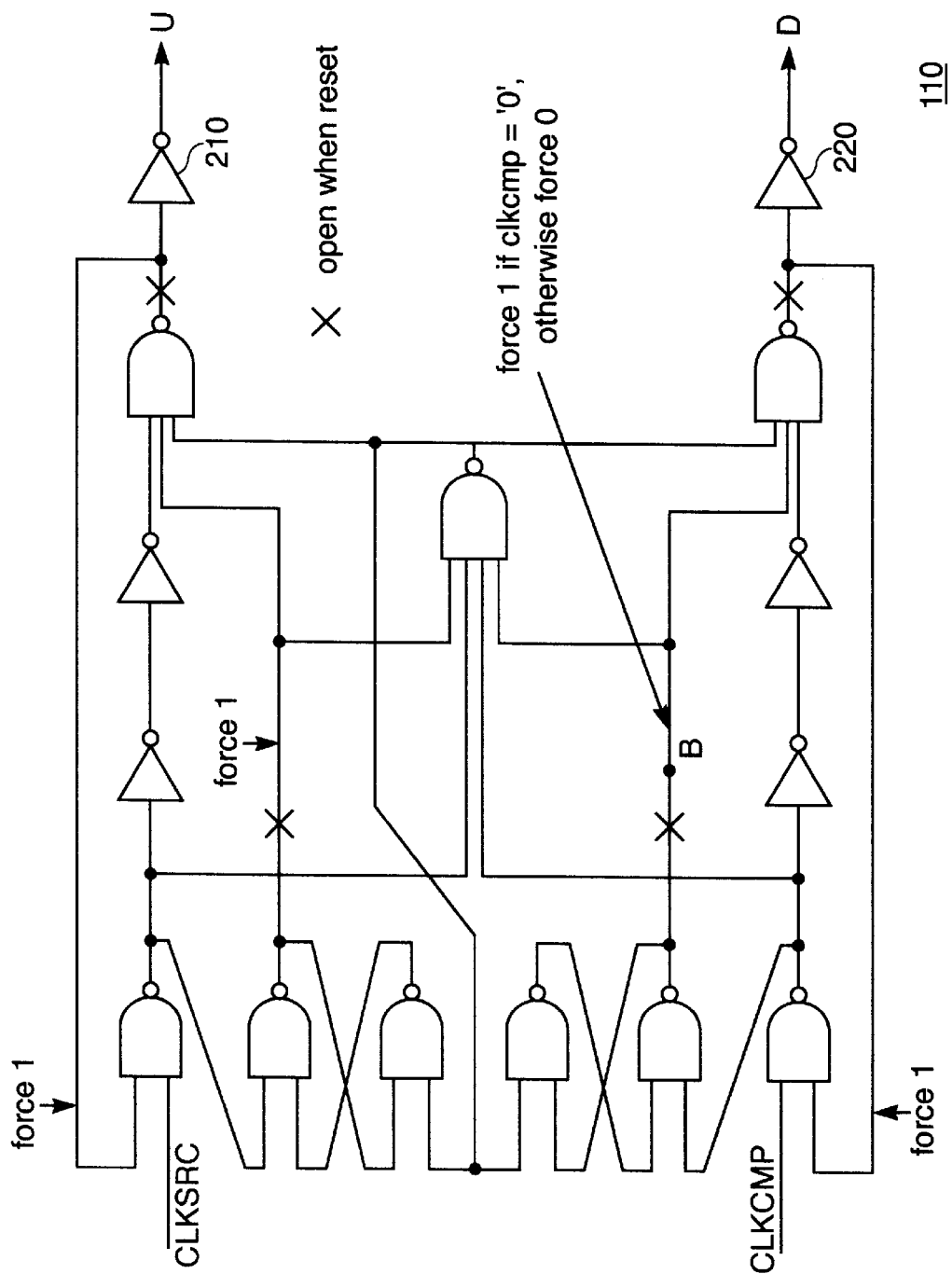
FIG. 2 is a block diagram of the phase comparator with initial condition circuit 110 of FIG. 1.

FIG. 2 is a block diagram of the phase comparator with initial condition circuit 110 of FIG. 1. Additional initial condition circuitry for breaking the feedback path may be inserted to insure lock-in of the digital delay lock loop of FIG. 1 and to help it to settle down more quickly. Outputs up U and down D may comprise short pulses whose duration varies during operation in proportion to the phase difference between signals CLKSRC and CLKCMP. To ensure consistent control, a pulse regeneration circuit (not shown) may be provided using flip-flops to generate an ideal pulse with sufficient intervals.

Figure 9:
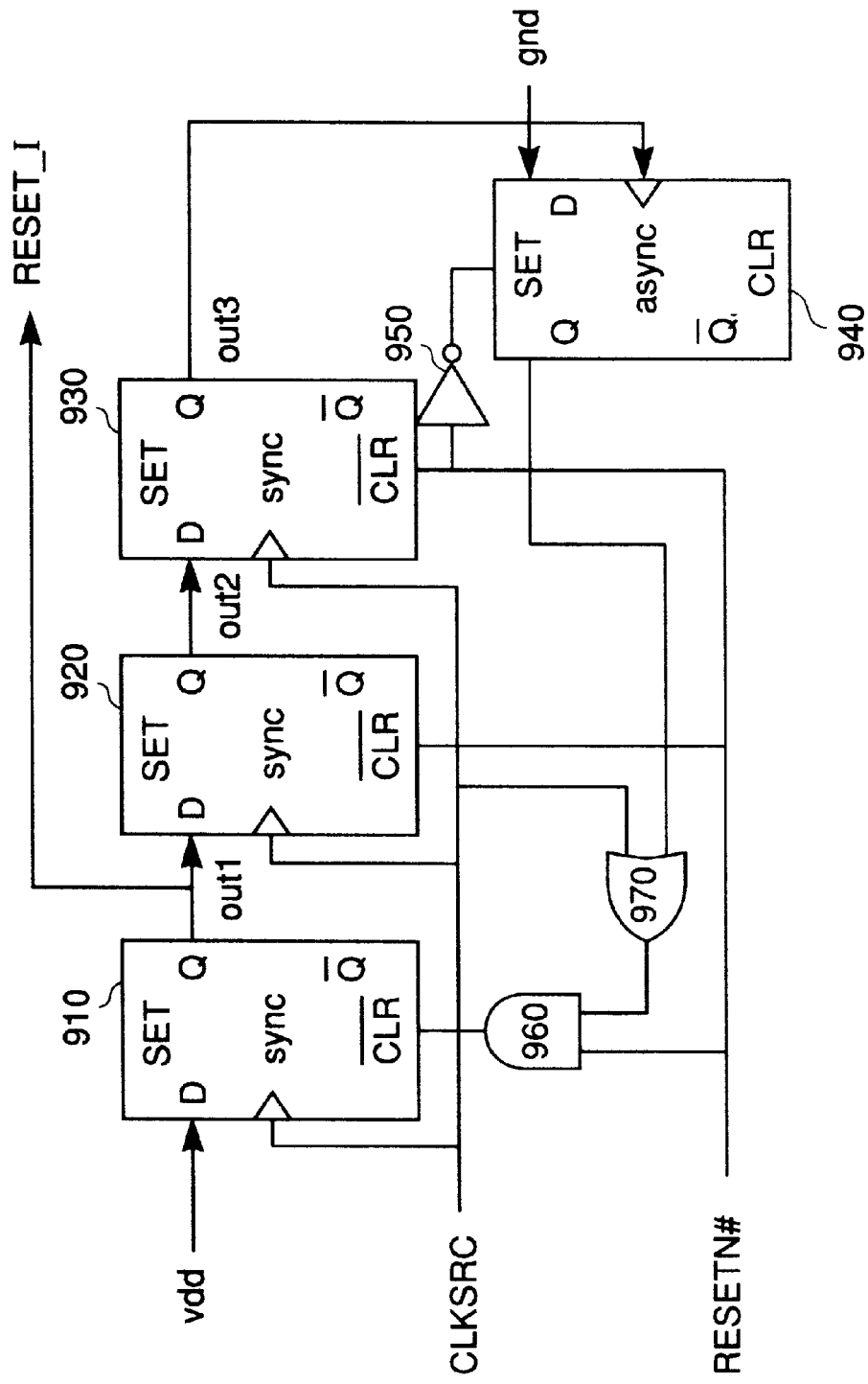
FIG. 9 is a block diagram of a power-on self reset circuit.

Some elements of phase comparator 110 of FIG. 2 are similar to those in the phase comparator of FIG. 9.45 in *Principles of CMOS VLSI Design*, Neil H. E. Weste and Kamran Eshraghian, Addison-Wesley Publishing Co, New York, pages 685–686, incorporated herein by reference. Weste et al. teaches using a phase detector for an analog phase locked loop (PLL) with the outputs feeding a charge pump. Weste et al. does not disclose compensating his phase comparator for initial conditions.

The phase detector of Weste et al. has been modified in FIG. 2 to compensate for reset conditions as follows. Where indicated by an "X", portions of the circuit of phase comparator 110 may be opened when a reset condition occurs. As will be appreciated by one of ordinary skill in the art, appropriate combinational logic may be used to achieve such a condition. A signal RESET_I, discussed below in connection with FIG. 9, may be generated (e.g., go high for a predetermined time period upon reset). An appropriate AND gate (or other appropriate or equivalent logic) may be inserted where each "XX" is located to selectively close or open the circuit, as gated by an inverted RESET_I signal. Alternately, a pull-down resistor or the like, coupled to an AND gate, MUX, or other switching device (e.g., transistor) may literally pull the signal line to a low logic voltage level upon reset when driven by the RESET_I signal.

Other portions of the circuit of phase comparator 110 may be forced high upon reset, as indicated in FIG. 2. Again, one of ordinary skill in the art will appreciate that appropriate combinational logic circuitry or the equivalent thereof may be implemented to drive portions of the circuit high upon reset. For example, an OR gate (or other appropriate or equivalent logic) may OR the signal line with the signal RESET_I such that the signal line will be forced high when signal RESET_I is high. Alternately, a pull-up resistor or the like, coupled to an AND gate, MUX, or other switching device (e.g., transistor) may literally pull the signal line to a high logic voltage level upon reset when driven by the RESET_I signal.

Note that one portion of the circuit of phase compartor 110 at node B may be selectively forced high or low, depending upon the state of signal CLKCMP. Again, one of ordinary skill in the art will appreciate that appropriate combinational logic circuitry or the equivalent thereof may be implemented to drive portions of the circuit high upon reset. For example, an AND gate (or other appropriate or equivalent logic) driven by signal RESET_I and the inverse of signal CLKCMP may pull the signal line at node B high through use of a pull-up resistor or the like during the reset period when signal CLKCMP is low. A similar AND gate or equivalent logic, driven by signal RESET_I and CLKCMP may pull the signal line at node B low through use of a pull-down resistor during the reset period when signal CLKCMP is high.

The duration of the reset period (and signal RESET_I) may be determined empirically and may be programmable or adjustable in order to prove appropriate dampening during reset conditions to allow the circuit to more quickly and accurately lock at a desired frequency. During the reset period, the input to final inverter 210 and 220 is pulled high, driving both outputs U and D low. As a result, the amount of delay in the line will remain static during the reset period.

Although the present invention will operate without the use of a reset signal or reset period, the use of such a reset configuration will enhance the performance of the apparatus of the present invention by preventing the system from 'hunting' during startup due to initial conditions or the like. Once the circuit has stabilized, the signal RESET_I may be removed, and phase comparator 110 appropriately adjust phase between signals CLKSRC and CLKCMP.

Figure 3:
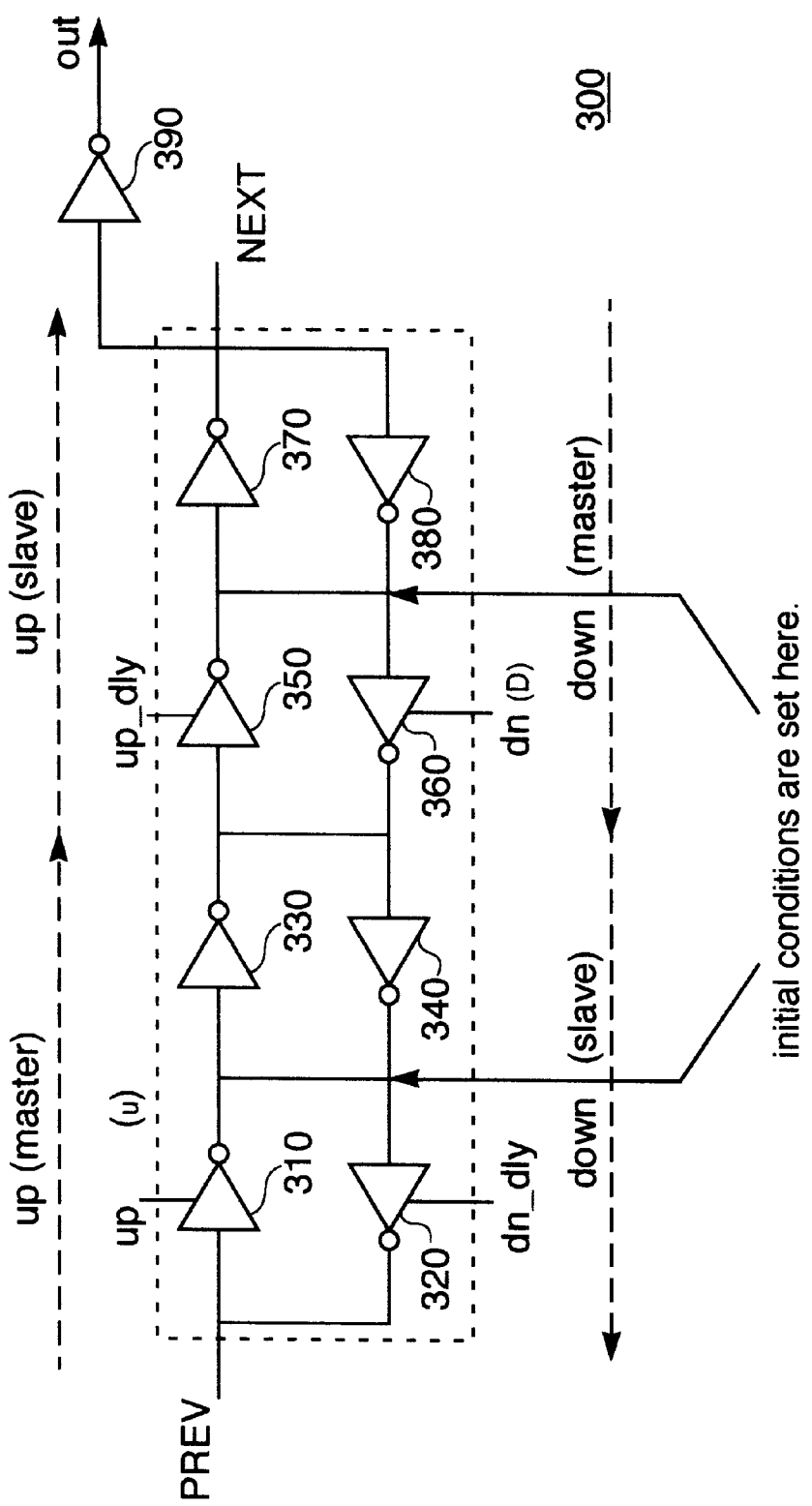
FIG. 3 is a block diagram of one element of up/down shift registers 120 of FIG. 1.

FIG. 3 is a block diagram of one up/down shift register 300 of up/down shift registers 120 of FIG. 1. Up/down shift register 300 is a derivation of a flip-flop, but provides two-way data transfer capability. Up/down shift registers 120 comprises a number of inverter pairs, 310 and 320, 330 and 340, 350 and 360, and 370 and 380.

Up/down shift register 300 works in a master-slave scheme. When an up pulse U is coming, input PREV will be written to the middle node (inverter pair 330 and 340) from the prev node (inverter pair 310 and 320) via the master route. A delayed pulse up_dly, generated from up pulse U, will propagate the signal via the slave node (inverter pair 350 and 360) to the output node (inverter pair 370 and 380).

Signal NEXT may be generated from the output node and will be fed as signal PREV to the next up/down shift register 300 in up/down shift registers 120. An output signal OUT may be generated by inverter 390 which inverts the bit stored in the output node (inverters 370 and 380). Up/down shift register 300 is similar in structure to an SRAM.

Reference is made to "350 MHz Time-Multiplexed 8-Port SRAM and Word-Size Variable Multiplier for Multimedia DSP", by Toshinari Takayanagi et al. (Toshiba Corp, Kawasaki, Japan), incorporated herein by reference. Takayanagi et al. discloses an SRAM cell, but does not disclose using such an SRAM cell as an up/down shift register, nor using such a cell in a digital delay lock loop.

When an down pulse D is coming, the input will be written to the middle node from the next node via the master route. A delayed pulse down_dly, generated from down pulse D, will propagate the signal to the output next via the slave route. Because the embedded feedback paths exist, this is a static logic design, and data stored in shift registers 120 will not be lost, even if the device is not exercised for a time. Moreover, the construction of up/down shift register 300 reduces the amount of combinational logic required to ordinarily implement such a shift register, thus reducing gate count and overall cost and size of the device.

In the preferred embodiment, up pulse U and down pulse D may be on the order to 1–2 nS each. The delay between up pulse U and delayed up pulse up_dly (and down pulse D and delayed down pulse down_dly) may be on the order of approximately 5 nS. Different values may be used to provide proper propagation of signals.

In the preferred embodiment, one up/down shift register 300 is provided for every four delay elements of variable delay line 130 as discussed below in connection with FIG. 5B. only one up/down shift register 300 of up/down shift registers 120 contains a high bit ("1") while the rest of the bits in the register are low. The position of the high bit within the shift register indicates to variable delay line 130 how much a of a delay should be used. An up pulse U may advance the position of the high ("1") bit in the shift register (e.g., LSB to MSB), while a down pulse D may move the position of the high bit in the opposite direction (e.g., MSB to LSB).

Figure 4:
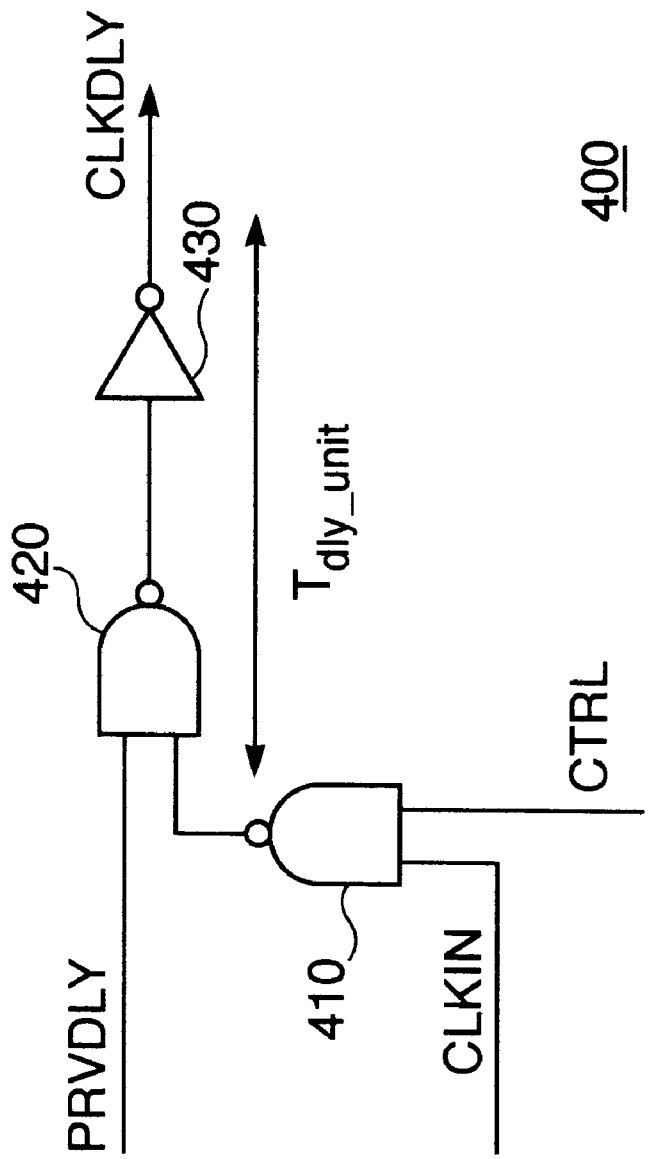
FIG. 4 is a block diagram of one delay element of variable delay line 130 of FIG. 1.

FIG. 4 is a block diagram of one delay element 400 of variable delay line 130 of FIG. 1. Each delay element 400 comprises a two-input NAND cell 420 and one small inverter 430. NAND cell 410 may control activation of delay element(s). Delay element 400 provides enough resolution for DLL operation for self adjustment, while consuming very little silicon area. According to HSPICE simulations, each delay element 400 may provide from 0.1 nS to 0.25 nS delay.

Figure 5A:
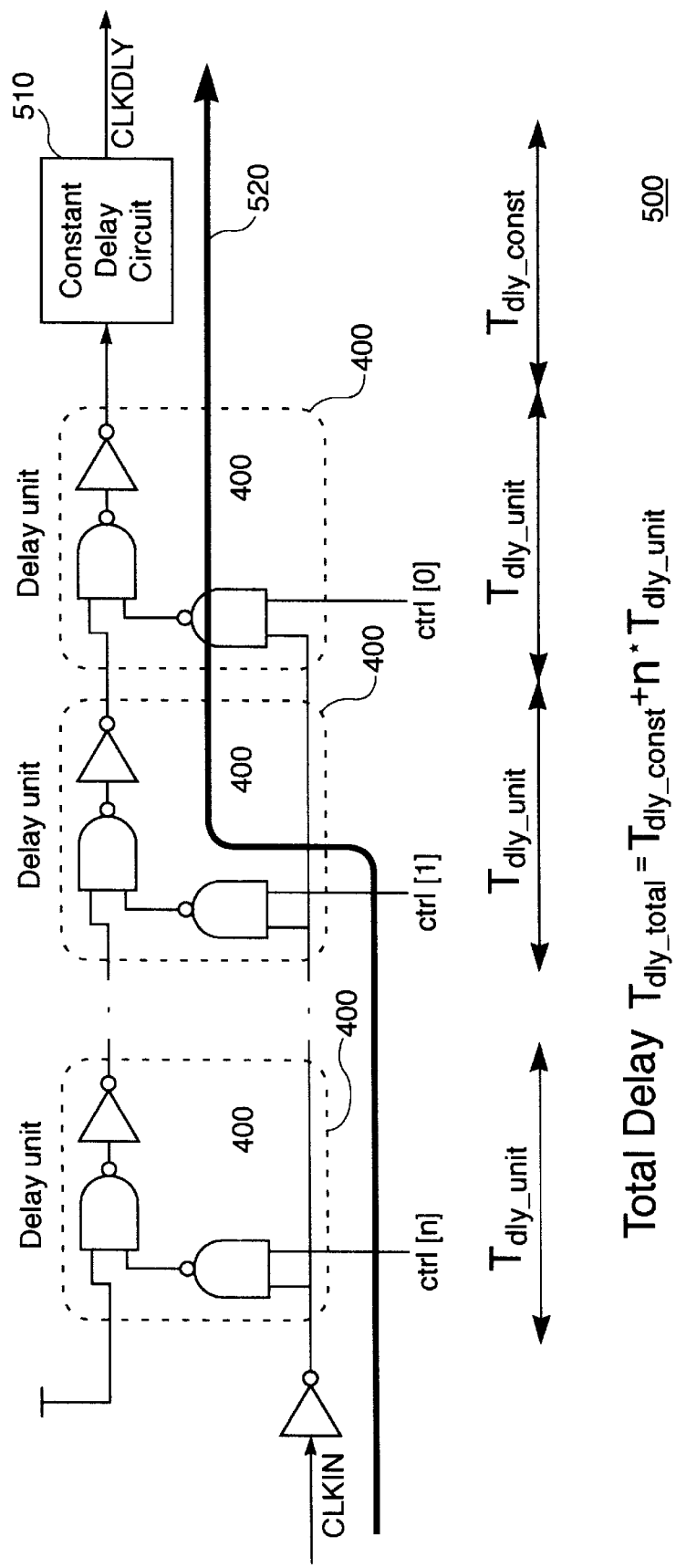
FIG. 5A is a block diagram illustrating how delay elements of FIG. 4 are combined to form one segment of variable delay line 130 of FIG. 1.

FIG. 5A is a block diagram illustrating how delay elements of FIG. 4 are combined to form one segment 500 of variable delay line 130 of FIG. 1. Reference is made to a delay line disclosed "Digital Delay Locked Loop and Design Technique for High-Speed Synchronous Interface" by Yoshimori Okajima, Masuo Taguchi, Miki Yanagawa, Koichi Mishimura, and Osamu Hamada, in IEICE publication "IEICE TRANS. ELECTRON, VOL. 179-C" dated Jun. 6, 1996, incorporated herein by reference. Okajima et al., FIG. 7, discloses a digital to time converter comprising a plurality of elements each comprising two NAND gates and an inverter. Okajima et al. does not disclose a constant delay circuit. Okajima discloses driving the digital to time converter using a shift register.

In the preferred embodiment, variable delay line 130 may comprise four segments 500, each segment 500 comprising 40 delay elements 400. Other numbers of delay elements 40 may be used within the spirit and scope of the present invention. For the sake of clarity, only one segment is illustrated in FIG. 5A. Each segment 500 may also include a constant (e.g., 2 nS) delay element 510. FIG. 5B illustrates four delay segments 500 in the preferred embodiment of the present invention coupled to shift registers 120. For the sake of clarity, constant delay elements 510 are not illustrated in FIG. 5B.

Figure 5B:
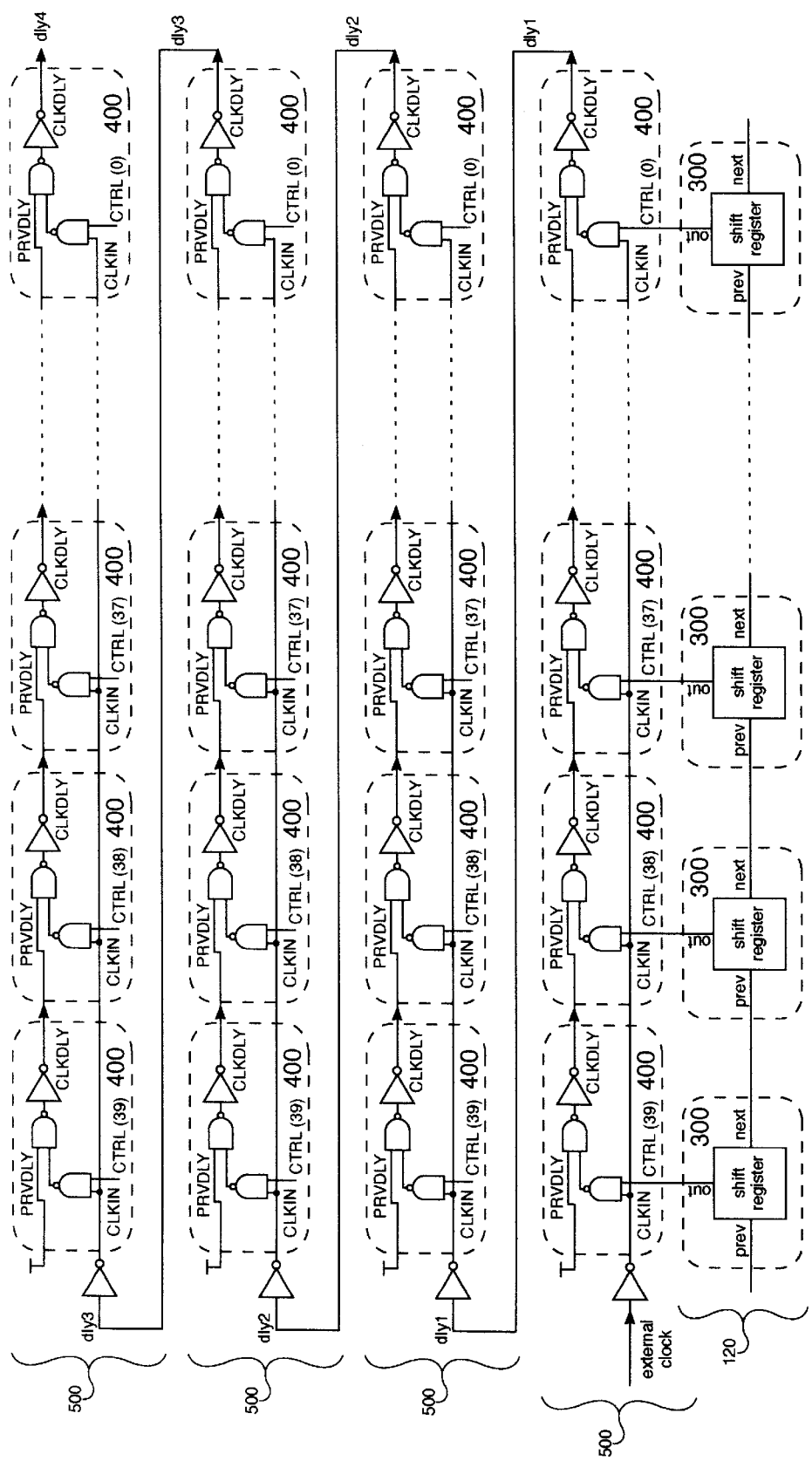
FIG. 5B is a block diagram illustrating how elements of variable delay line 130 are coupled to shift registers 120 of FIG. 1.

As illustrated in FIG. 5B, each shift register 300 has its NEXT output connected to the PREV input of an adjacent shift register. The output of each shift register 300 is in turn coupled to the CTRL inputs of one delay element 400 of each delay segment 500. Note that other numbers of delay segments 500 may be used, and other numbers of delay elements 400 may be used per segment. The use of 40 delay elements 400 per delay segment 500 is illustrated only to set forth the best mode contemplated by the inventors and in no way should be interpreted as limiting the spirit and scope of the present invention.

Control signals ctrl[0], ctrl[1], . . . , ctrl[n], selectively activate one or more of delay elements 400. Only one of control signals ctrl [1], ctrl [2], . . . , ctrl[n] will be active (e.g., '1') and the rest will be inactive (e.g., '0'). As illustrated by arrow 520 in FIG. 5A, subsequent delay elements 400 will be activated.

TABLE I

| CTRL | CLKIN | PRVDLY | NAND 410 | NAND 420 | CLKDLY 430 |
|---|---|---|---|---|---|
| 0 | 0 | 0 | 1 | 1 | 0 |
| 0 | 0 | 1 | 1 | 0 | 1 |
| 0 | 1 | 0 | 1 | 1 | 0 |
| 0 | 1 | 1 | 1 | 0 | 1 |
| 1 | 0 | 0 | 1 | 1 | 0 |
| 1 | 0 | 1 | 1 | 0 | 1 |
| 1 | 1 | 0 | 0 | 1 | 0 |
| 1 | 1 | 1 | 0 | 1 | 0 |

Table I is a truth table for delay element 400 of FIG. 4. Table I may be initially appear somewhat confusing. Table II is an abbreviated version of Table I which more clearly indicates the function of delay element 400. Table II illustrates that when signal CTRL is asserted, the output CLKDLY will follow CLKIN. If signal CTRL is de-asserted, output CLKDLY will follow PRVDLY.

TABLE II

| CTRL | CLKIN | PRVDLY | CLKDLY |
|---|---|---|---|
| 1 | _⎍⎍_ | X | _⎍⎍_ |
| 0 | X | _⎍⎍_ | _⎍⎍_ |

Table III is a modified version of the truth table of Table I for the special condition where signal PRVDLY is held high, as is the case in the first delay element in each segment 500 of FIG. 5A. As illustrated in Table III, when signal CTRL is low, the output CLKDLY of such a delay element 400 will always be high. When signal CTRL goes low, output CLKDLY will be the inverse of the input clock signal CLKIN. Thus, the outputs for all delay elements 400 from n to 2 will be high, as signals ctrl[n], ctrl[n−1], . . . ctrl[2] will all be low.

TABLE III

| CTRL | CLKIN | PRVDLY (HIGH) | NAND 410 | NAND 420 | CLKDLY 430 |
|---|---|---|---|---|---|
| 0 | 0 | 1 | 1 | 0 | 1 |
| 0 | 1 | 1 | 1 | 0 | 1 |
| 1 | 0 | 1 | 1 | 0 | 1 |
| 1 | 1 | 1 | 0 | 1 | 0 |

Table IV is a modified version of the truth table of TABLE I for the special condition where signal CRTL is high. As noted above, the outputs CLKDLY from all previous delay elements 400 will be high, as their corresponding control signals CTRL will be low. Thus, both signals CTRL and PRVDLY will be high.

As illustrated in Table IV, the output CLKDLY will be the inverse of signal CLKIN. In other words, the output of a delay element 400 will be a delayed version of signal CLKIN if signal CTRL is high.

TABLE IV

| CTRL (HIGH) | CLKIN | PRVDLY (HIGH) | NAND 410 | NAND 420 | CLKDLY 430 |
|---|---|---|---|---|---|
| 1 | 0 | 1 | 1 | 0 | 1 |
| 1 | 1 | 1 | 0 | 1 | 0 |

The remaining delay elements 400 in the series are automatically activated by any previous delay element 400 which has been enabled by signal CTRL. Table V is a modified version of the truth table of Table I for the special case where signal CTRL is low, but signal PRVDLY is toggled.

TABLE V

| CTRL (LOW) | CLKIN | PRVDLY | NAND 410 | NAND 420 | CLKDLY 430 |
|---|---|---|---|---|---|
| 0 | 0 | 0 | 1 | 1 | 0 |
| 0 | 0 | 1 | 1 | 0 | 1 |
| 0 | 1 | 0 | 1 | 1 | 0 |
| 0 | 1 | 1 | 1 | 0 | 1 |

As illustrated in Table V, the output CLKDLY will mirror the input PRVDLY, after a suitable delay induced by the gates themselves. Thus, as illustrated in FIG. 5A, only one control signal of control signals ctrl[n], . . . , ctrl[2], ctrl[1] need be activated in order to switch on a number of delay elements. If signal ctrl[2] is held high, two delay elements are activated. If signal ctrl[n] is activated, n delay elements are activated, as so on.

The use of 2 nS delay element 510 may have certain advantages. First, the total number of delay elements and shift registers may be reduced. If this 2 nS delay were to be achieved using additional delay elements 400, at least another 80 delay elements 400 may be required, along with another 20 shift registers, increasing the size of the circuit by approximately 50%.

Second, with sufficient delay, the use of constant delay circuit 510 may prevent the digital delay lock loop of the present invention from locking at 4× clock signal CLKSRC. If the duration of constant delay circuit 510 exceeds ⅛ of the cycle time, the circuit may not lock at 4 times clock signal CLKSRC and insure correct 2× locking.

Note that the value of 2 nS is based upon empirical calculations and measurements for a particular circuit type, to introduce a fixed delay which may compensate or inherent delays in the circuit. The value of 2 nS is by way of example only and should not be taken as limiting the spirit and scope of the present invention in any way whatsoever.

Figure 6A:
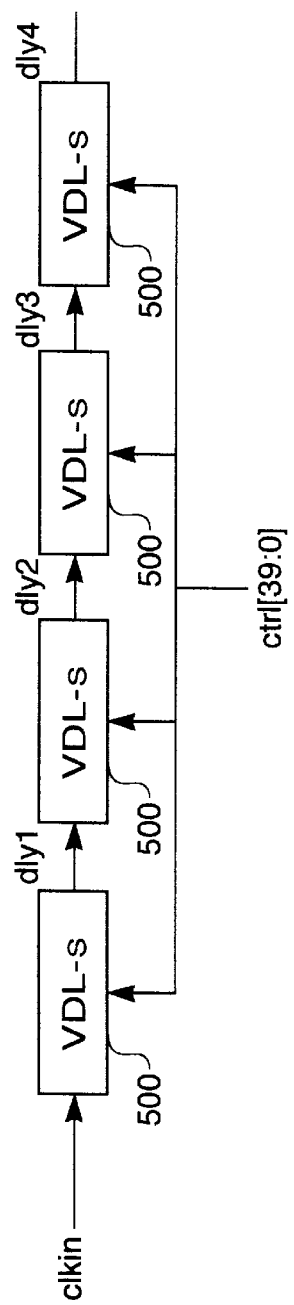
FIG. 6A is a block diagram illustrating connectivity of each delay segment 500 of FIG. 5 to form a variable delay line 130 of FIG. 1.
Figure 6B:
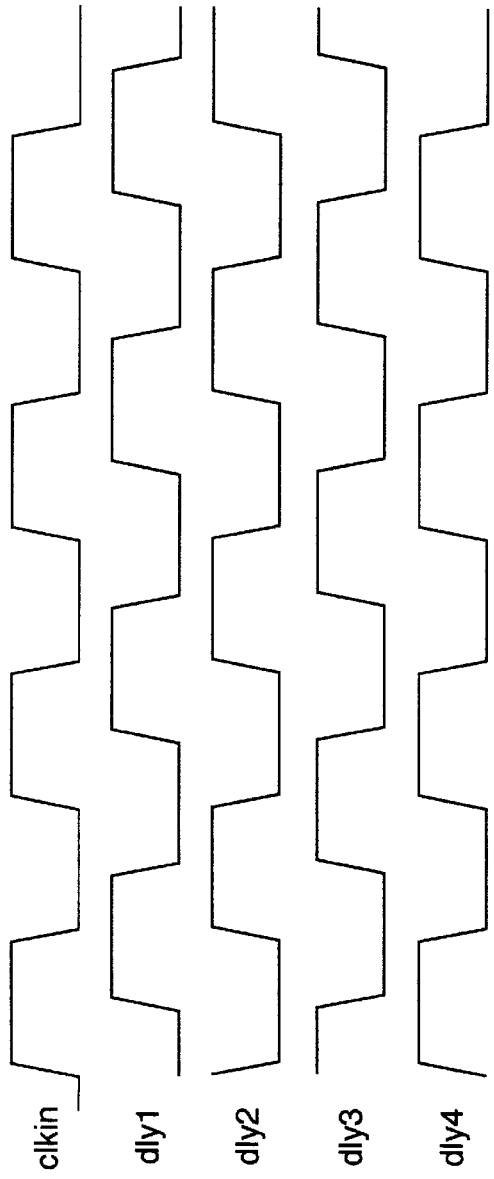
FIG. 6B is a waveform diagram illustrating propagation of clocking signals through elements of variable delay line 130 in FIG. 6A.

FIG. 6A is a block diagram illustrating connectivity of each delay segment 500 of FIG. 5 to form a variable delay line 130 of FIG. 1. FIG. 6B is a waveform diagram illustrating propagation of clocking signals through elements of variable delay line 130 in FIG. 6A.

The overall design goal of the present invention is to provide a clock frequency doubler. However, as noted above, the digital delay lock loop of the present invention may be provided to lock two clock signals in phase regardless of multiplication. If one wishes to provide one cycle delay at the end of the delay line to match the phase, ideally each segment 500 delays for ($T_{period}/4$) as illustrated in FIGS. 6A and 6B. As illustrated in FIG. 6B, each variable delay line segment 500 will delay its input for approximately one-quarter cycle.

Clock duty cycle is defined as the ratio between the amount of time a clock signal is high (e.g., logic 1) and the amount of time a clock signal is low (e.g., logic 0). Ideally, a clock duty cycle should be 50%—50%. As duty cycle of the clock may not be guaranteed to be 50%—50%, generating the 2× frequency by using combinational logic (AND, OR, XOR, and the like) may be impractical and prone to cause large variations in the output clock duty cycle.

Thus, a novel clock generator is provided to generate a 2× clock signal. The key issue is that no matter what the duty cycle of the input clock signal, the phase relationship is should be correct and the interval should be approximately one-quarter cycle. Thus, the input clock signal may be used to generate a 2× clock. For each delay signal dly1, dly2, dly3, and dly4, a corresponding pulse is generated according to their rising edges by using the pulse generating circuit illustrated in FIG. 7.

Figure 7:
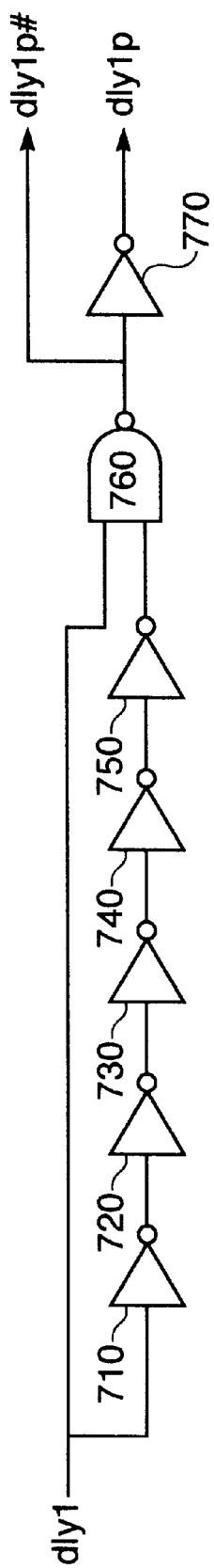
FIG. 7 is a block diagram of a pulse generating circuit.

FIG. 7 is a block diagram of a pulse generating circuit. Input dly1 is fed to inverters 710, 720, 730, 740, and 750 which delay and invert signal dly1. The output of inverter 750 and signal dly1 are fed to NAND gate 760 which will output a high logic value only when both inputs are low. The output of NAND gate 760 may be inverted by inverter 770 to output a delay pulse dly1p occurring on the rising edge of signal dly1.

Similar circuitry may be replicated to produce delay pulses dly2p, dly3p, and dly4p for the other three delay signals. The duration of pulses dly1p, dly2p, dly3p, and dly4p may be set to a suitably short time period (e.g., one quarter wavelength or less of clock signal CLKSRC).

Figure 8B:
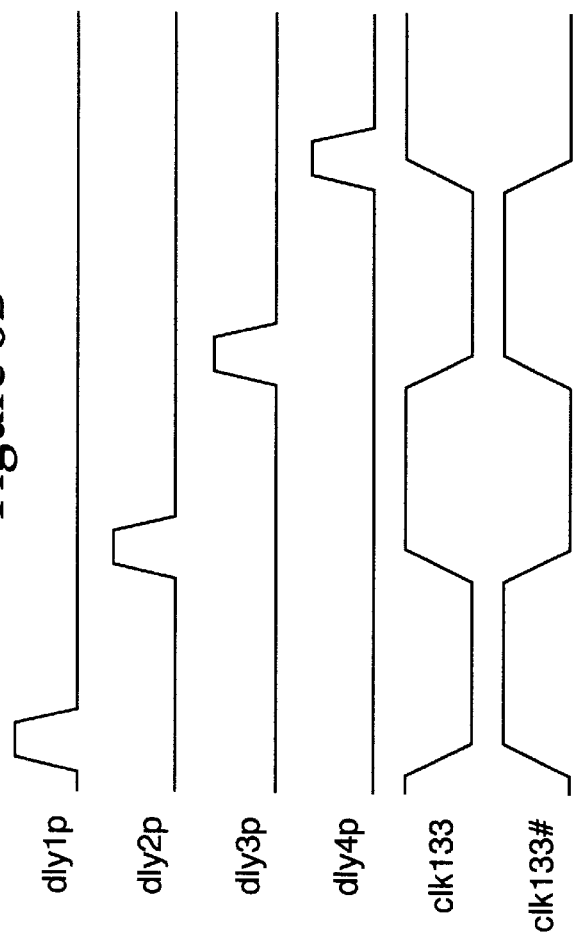
FIG. 8B is a waveform diagram illustrating the waveforms of the 2× clock generation circuit of FIG. 8A.
Figure 8A:
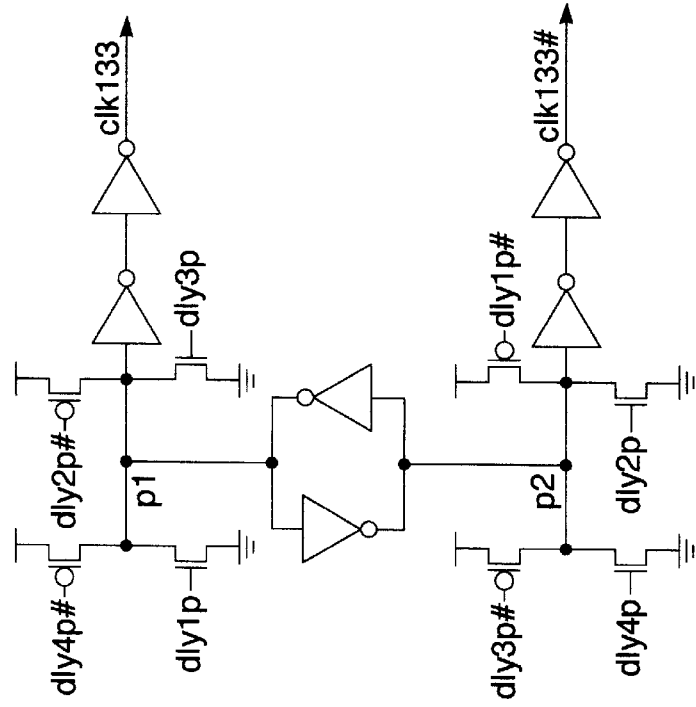
FIG. 8A is a block diagram of 2× clock generation circuit 140 of FIG. 1.

FIG. 8A is a block diagram of 2× clock generation circuit 140 of FIG. 1. FIG. 8B is a waveform diagram illustrating the waveforms of the 2× clock generation circuit of FIG. 8A. The pulses generated by the circuit of FIG. 7 may then trigger a special clock generator circuit illustrated in FIG. 8A to generate the desired 2× clock waveform. Since the outputs only rely on the rising edge of each delayed signal, the duty cycle of the generated clock is roughly 50%—50%, regardless of the duty cycle of input clock signal CLKSRC. Signal CLK133 and CLK133# are desired output waveforms which may be buffered by large output driving buffers to generate 2× clock signal CLKX2.

As discussed above, the performance of digital delay lock loop of the present invention may be enhanced by resetting the circuit before it starts locking into a desired 2× clock. During reset, the digital delay lock loop of the present invention may properly configure its internal states and read certain external control signals during power-on start-up. For this purpose, an internal power-on self-reset signal RESET_I may be generated according to a system reset circuit of FIG. 9.

In addition, the reset feature of the present invention may have other uses. In addition to reducing synchronization time after a global power-on reset, the apparatus of the present invention may be quickly reset if mis-synchronization is found later. In addition, to reduce power consumption, the clock doubler circuit may be disabled if an AGP port is not being used (e.g., during stasis, sleep, or stand-by modes). The reset initialization circuit of the present invention allows the clock doubler circuit to quickly lock at frequency and phase when the AGP port is to be used. In addition, parameters such as initial frequency setting, initial U/D register setting, and the like may be read (and set) during reset or power-on self test (POST).

Figure 10:
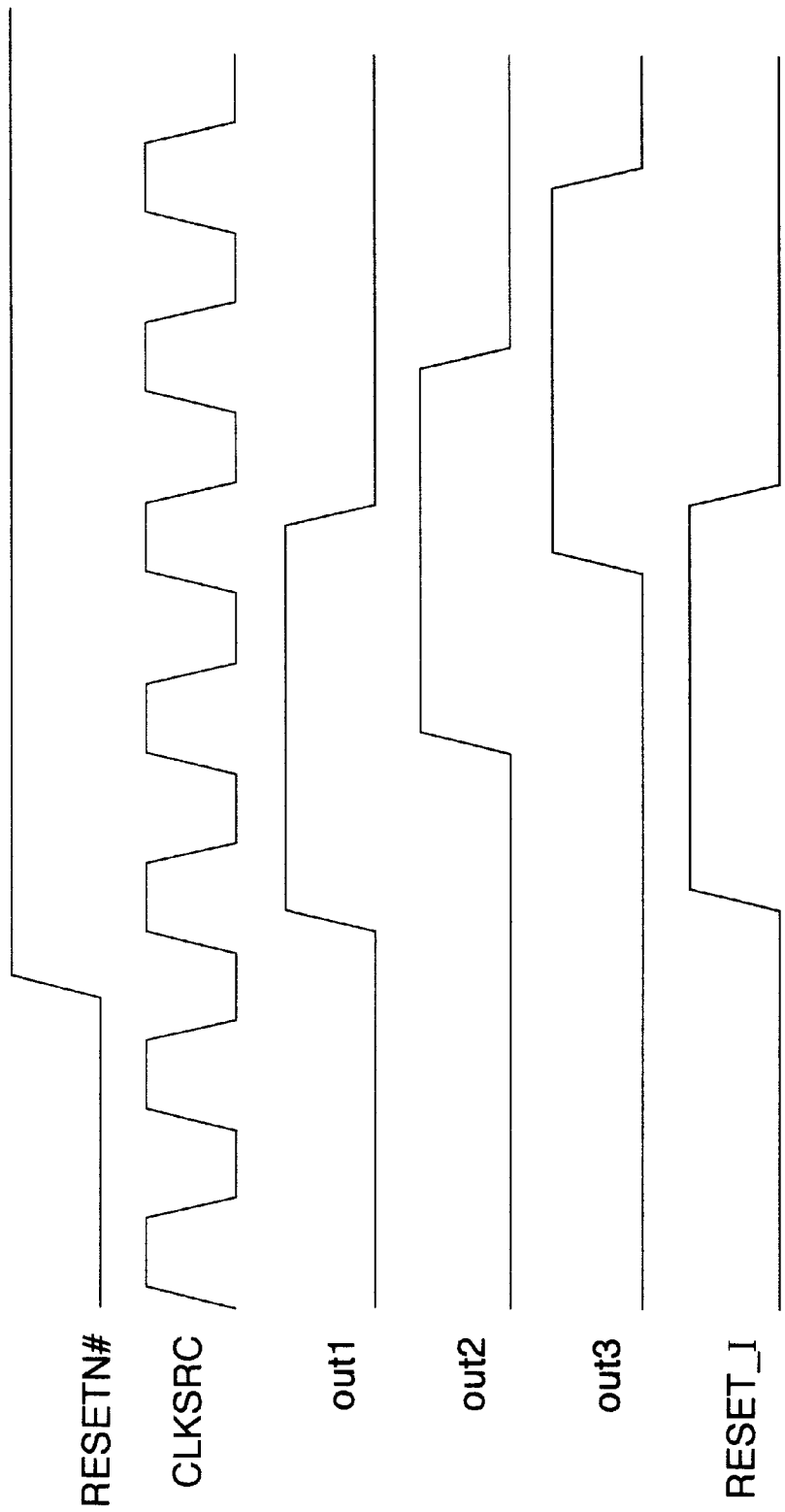
FIG. 10 is a waveform diagram illustrating the timing of the power on self reset (POSR) signal.

FIG. 9 is a block diagram of a power-on self reset circuit. Power-on self reset circuit 900 may comprise D-type flip-flops 910, 920, 930, and 940, inverter 950, AND gate 960 and OR gate 970. FIG. 10 is a waveform diagram illustrating the waveforms for the various elements of power-on reset circuit 900 of FIG. 9.

Clock signal CLKSRC may drive D-type flip-flops 910, 920, and 930. Flip-flop 910 may be supplied with a high logic signal (e.g., $V_{DD}$) at its D input. Signal RESETN# may be the compliment of a system reset signal (RESETN) indicating that the system has been reset or powered up. Upon power-up, signal RESETN# will be low, and transition to a high state once reset has been competed.

The Q output of D-type flip-flop 910 will go high at the first rising edge of signal CLKSRC, driving signal OUT1 (and by extension RESET_I) high. Signal OUT1 will be fed to the D input of flip-flop 920 which will drive signal OUT2 high at the next rising edge of CLKSRC. Similarly, signal OUT2 will be fed to the D input of flip-flop 930 which will drive signal OUT3 high at the next rising edge of CLKSRC.

Signal OUT3 will clock D-type flip-flop 940 which in turn will output a signal to OR gate 970. OR gate 970 will OR the output with signal CLKSRC and output the result to AND gate 960. AND gate 960 will AND the output of OR gate 970 with RESETN# signal to clear flip-flop 910. The output of flip-flop 910 will go low at the next trailing edge of clock signal CLKSRC as illustrated in FIG. 10. Flip-flops 920 and 930 are cleared by signal RESETN#.

In the preferred embodiment, signal RESET_I may be approximately 2–3 clock cycles (of input clock signal CLKSRC) to insure that delay signals have been generated and propagate through variable delay line 130. As illustrated in FIG. 10, the internal reset signal RESET_I is intended to end at the second half of input clock signal CLKSRC. Ending reset signal RESET_I at this point will help phase comparator 110 make the correct decision (U or D) at the first comparison.

Figure 11:
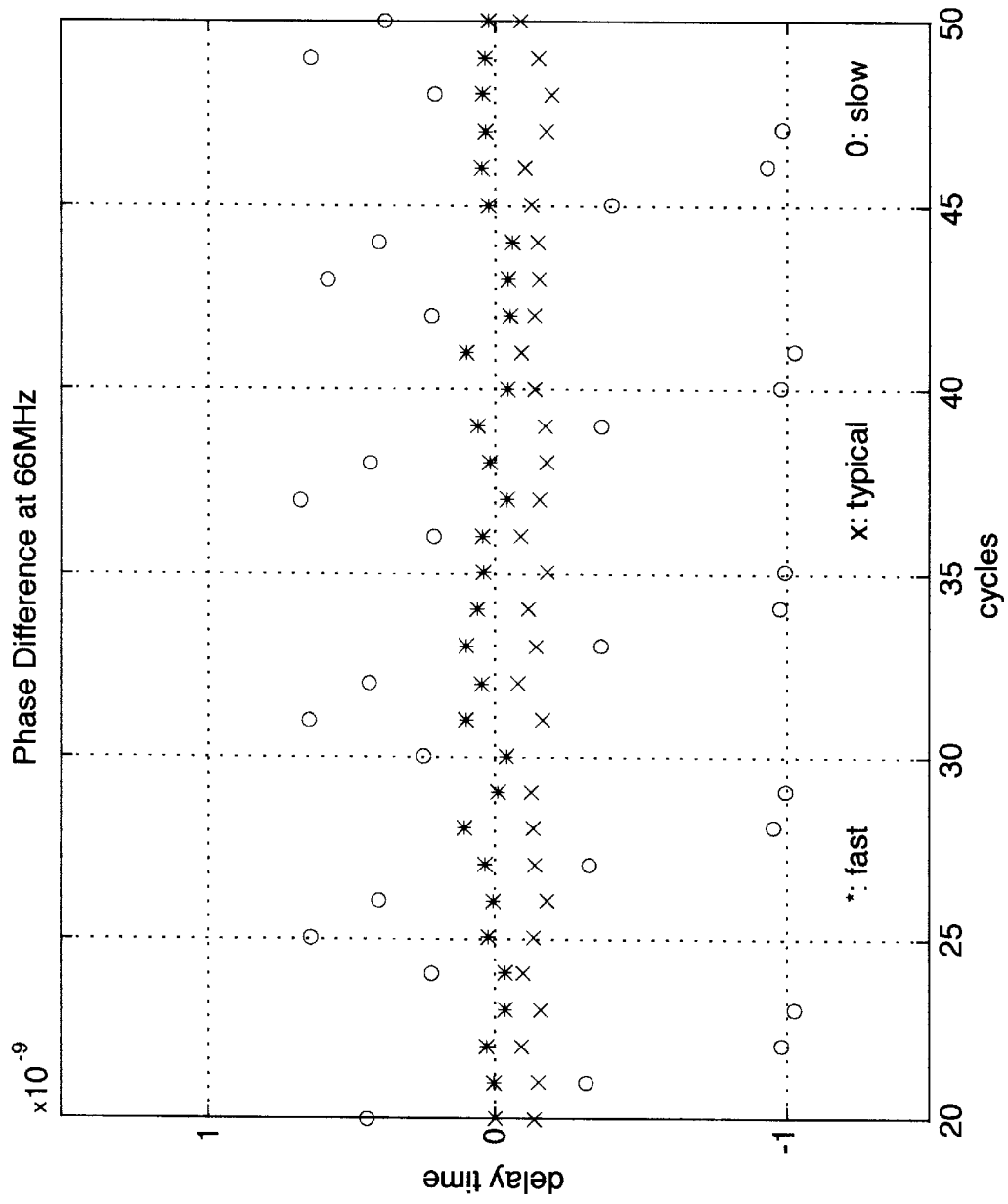
FIG. 11 is a graph illustrating a simulation result with an input phase difference at the phase comparator.

FIG. 11 is a graph illustrating a simulation result with an input phase difference at the phase comparator. This first simulation result illustrates the phase difference at the inputs of the phase comparator. Initially, the difference is large because the initial guess of phase difference may be incorrect. As subsequent cycles occur, the difference becomes smaller and smaller. For the typical and fast cases, the phase difference may be less than 0.5 nS after about 1000 nS of operation.

Figure 12:
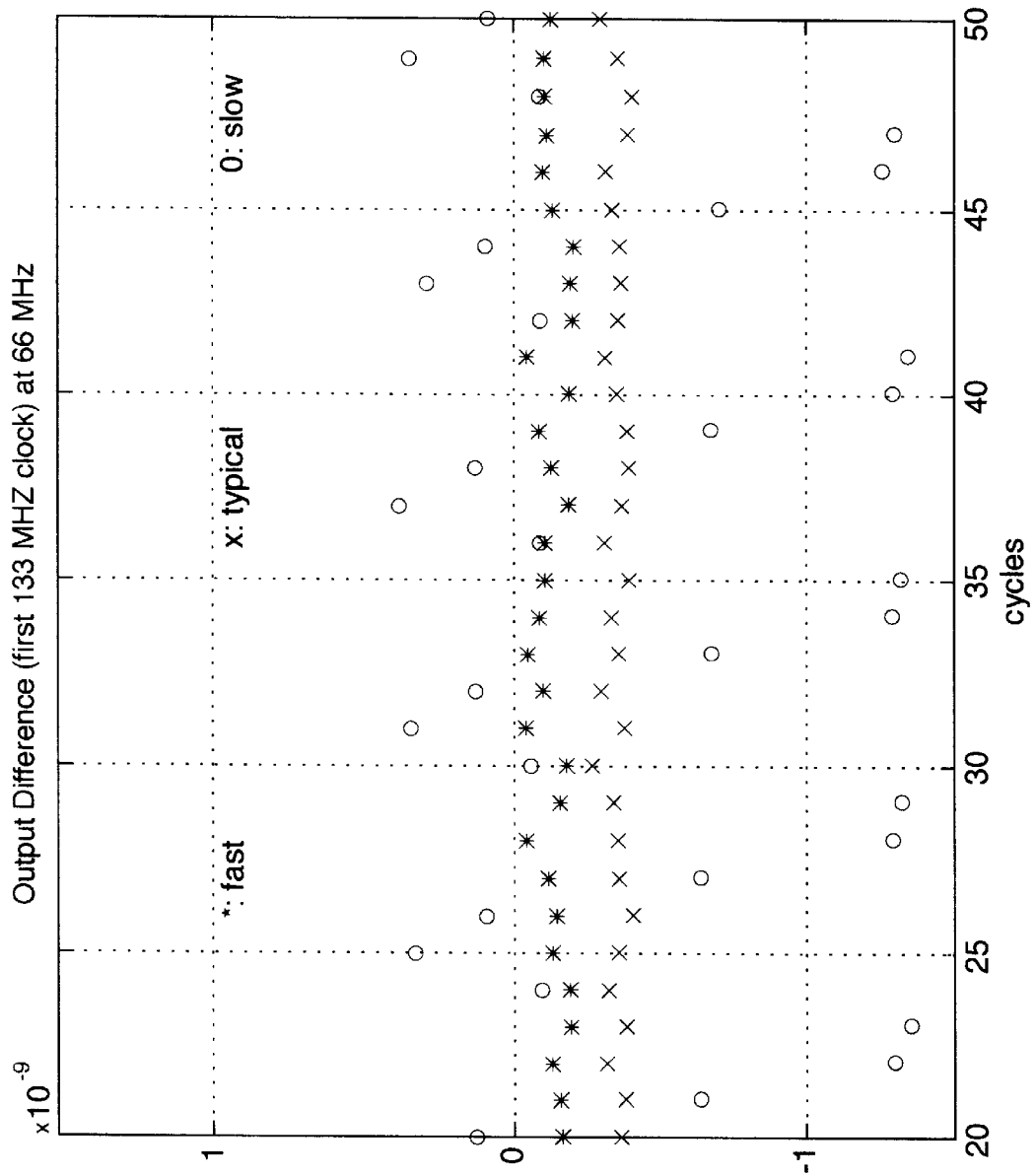
FIG. 12 is a graph illustrating a simulation result with a phase difference at the outputs of the 66 MHz clock and the 133 MHz first clock.

FIG. 12 is a graph illustrating a simulation result with a phase difference at the outputs of the 66 MHz clock and the 133 MHz first clock. This simulation illustrates the difference between the input clock CLKSRC the generated 2× clock signal CLKX2. For the simulation of FIG. 11, it is assumed that the input signal CLKSRC is 66 MHz. Thus, the 2× clock signal CLKX2 will be 133 MHz with a 7.5 nS period.

Figure 13:
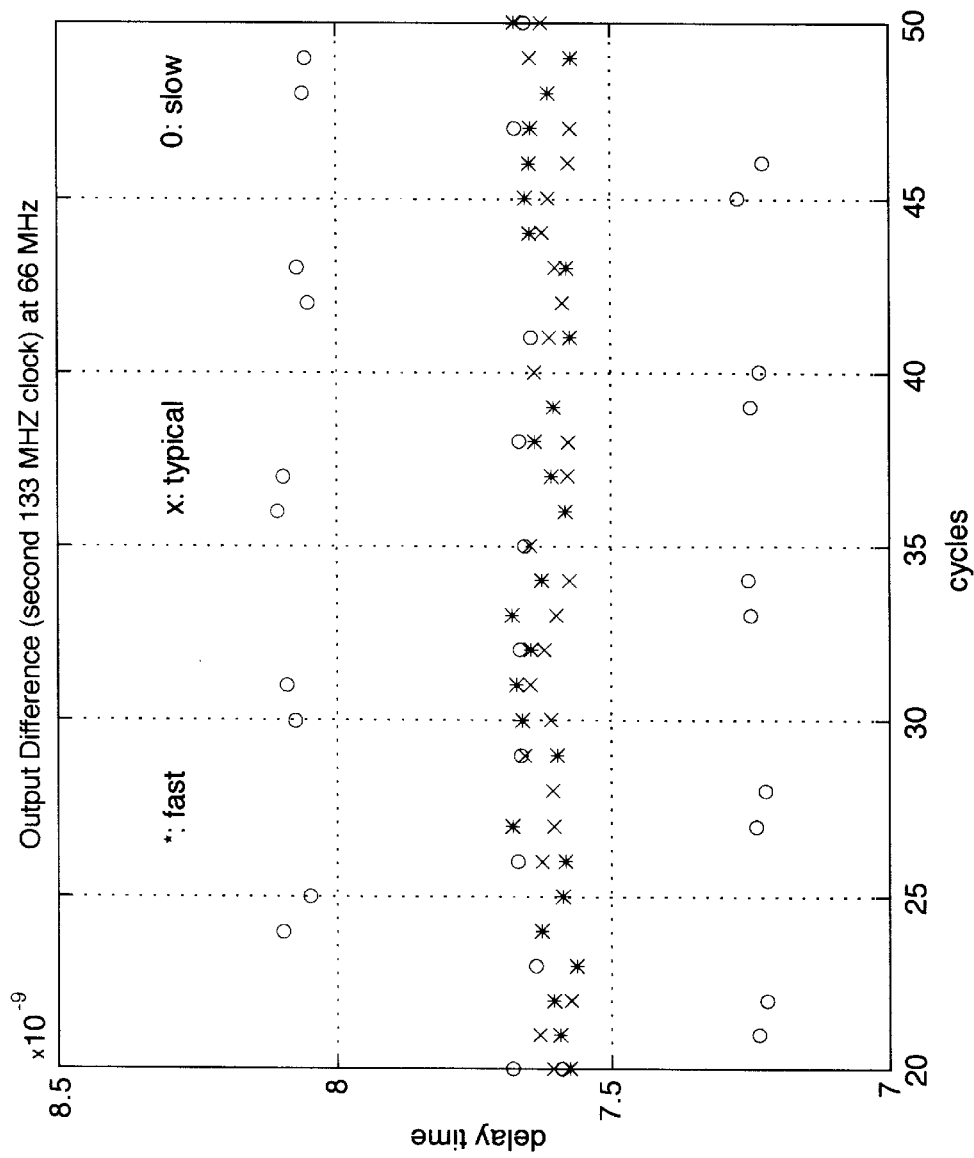
FIG. 13 is a graph illustrating a simulation result with a phase difference at the outputs of the 66 MHz clock and the 133 MHz clock second clock.

Therefore, with each 66 MHz cycle, there will be two 133 MHz cycles. In FIG. 12, the outputs at each of the 66 MHz clock source and the 133 MHz first clock source are compared. FIG. 13 is a graph illustrating a simulation result with a phase difference at the outputs of the 66 MHz clock and the 133 MHz clock second clock. It is apparent from FIGS. 12 and 13 that the first and the second phase difference are less than 0.5 nS for the typical and fast cases.

Figure 14:
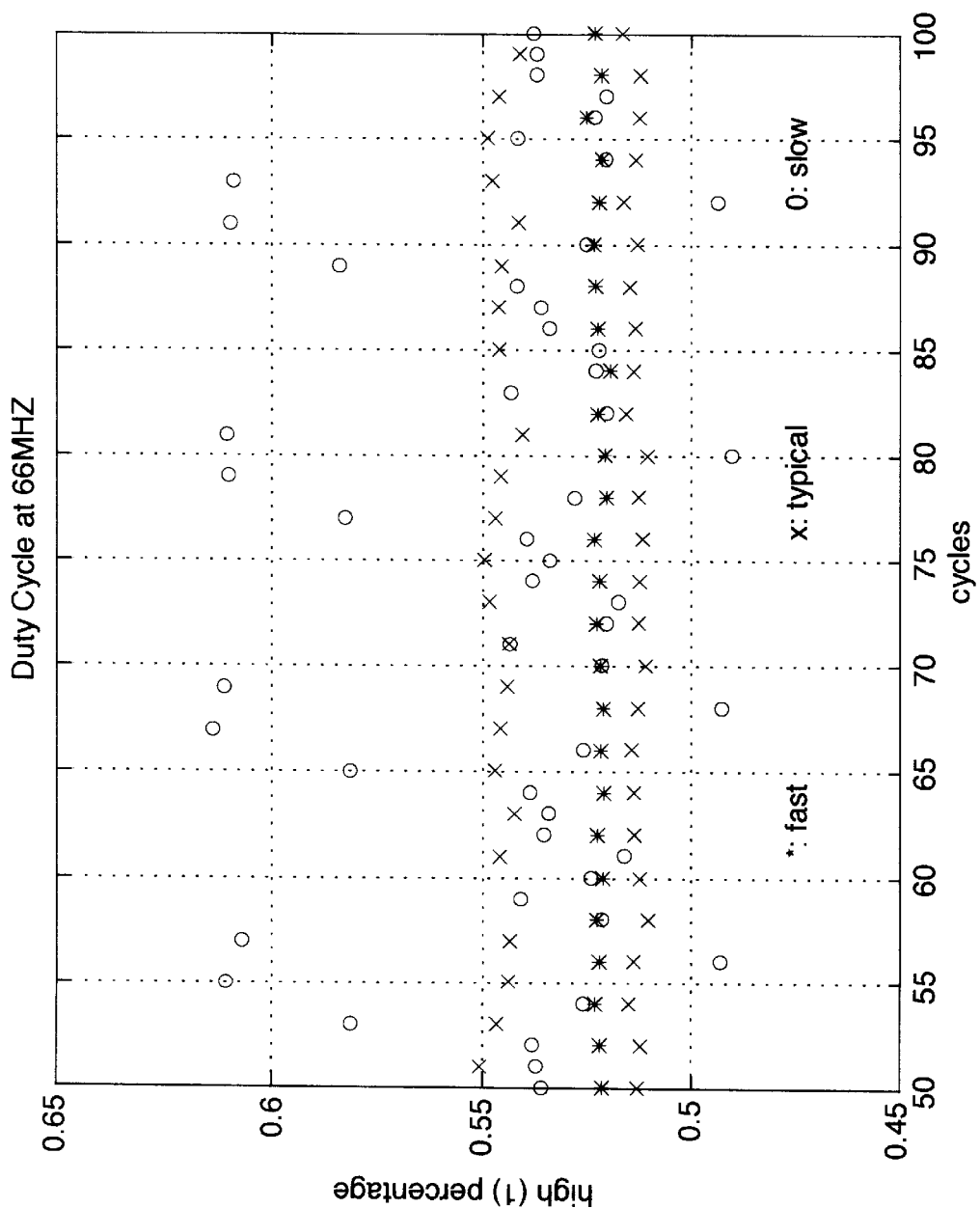
FIG. 14 is a graph illustrating a simulation result of the duty cycle of the 133 MHz clock output.

FIG. 14 is a graph illustrating a simulation result of the duty cycle of the 133 MHz clock output. As is apparent from FIG. 14, the duty cycle is about 50% to 53% for the typical and fast cases, well within an acceptable range of 50–55%.

While the preferred embodiment and various alternative embodiments of the invention have been disclosed and described in detail herein, it may be apparent to those skilled in the art that various changes in form and detail may be made therein without departing from the spirit and scope thereof.

What is claimed is:

1. A combined digital delay lock loop and frequency multiplier comprising:
   a phase comparator for comparing phase of a clock signal and a comparison clock signal and outputting a first signal indicating whether the clock signal leads or lags the comparison clock signal;
   up/down shift register, coupled to the phase comparator, for receiving the first signal and shifting a predetermined bit within the up/down shift register in a direction corresponding to a phase difference between the clock signal and the comparison clock signal;
   a variable delay line, coupled to the up/down shift register and receiving the clock signal, said variable delay line comprising a plurality of discrete fixed delay elements, each of the plurality of discrete fixed delay elements being activated and deactivated in response to a position of the predetermined bit in the up/down shift register for selectively delaying the clock signal by an amount proportional to the number of activated fixed delay elements to produce a delayed clock signal, said variable delay line further comprising a plurality of pulse generating circuits, each coupled to a corresponding one of said plurality of delay segments, for receiving a corresponding delay signal and producing a corresponding pulse at a predetermined edge of the corresponding delay signal; and
   a clock generator circuit, coupled to the plurality of pulse generating circuits, for generating a multiple clock signal, wherein an edge of the multiple clock signal is generated from a corresponding pulse from one of the plurality of pulse generating circuits, wherein said clock generator circuit comprises a clock multiplier, coupled to the variable delay line, for generating a multiple clock signal having a frequency multiple of the clock signal and in a predetermined phase relationship with the clock signal; and
   means, coupled to the clock multiplier, for receiving the multiple clock signal and generating the comparison clock signal.

2. The digital delay lock loop of claim 1, wherein said means for receiving the delayed clock signal and generating the comparison clock signal comprises:
   a divider, coupled to the clock multiplier and the phase comparator, for dividing the multiple clock signal to generate the comparison clock signal.

3. A digital delay lock comprising:
   a phase comparator for comparing phase of a clock signal and a comparison clock signal and outputting a first signal indicating whether the clock signal leads the comparison clock signal, and a second signal when the clock signal lags the comparison clock signal;
   up/down shift register, coupled to the phase comparator, for receiving the first signal and the second signal and shifting a predetermined bit within the up/down shift register in a direction corresponding to a phase difference between the clock signal and the comparison clock signal;
   a variable delay line, coupled to the up/down shift register and receiving the clock signal, said variable delay line comprising a plurality of discrete fixed delay elements, each of the plurality of discrete fixed delay elements being activated and deactivated in response to a position of the predetermined bit in the up/down shift register for selectively delaying the clock signal by an amount proportional to the number of activated fixed delay elements to produce a delayed clock signal; and
   means, coupled to the variable delay line, for receiving the delayed clock signal and generating the comparison clock signal,
   wherein said phase comparator further comprises:
      means for setting initial conditions of the phase comparator at reset, and wherein said means for setting initial conditions of the phase comparator at reset comprises:

means for receiving a reset signal and the clock signal and for generating an initial condition reset signal pulse having a predetermined period; and means, coupled to said phase comparator, for forcing portions of said phase comparator at predetermined logic levels during the initial condition reset signal pulse period.

4. The digital delay lock loop of claim 3, wherein said up/down shift register comprises a plurality of up/down shift registers coupled in series, each of said plurality of up/down shift registers comprising:

a master flip-flop for storing a first bit and for outputting the first bit to when the first signal is received; and a slave flip-flop, coupled to the master flip-flop, for receiving the first bit from the master flip-flop and outputting a second bit when a delayed first signal is received.

5. A method for multiplying a clock signal to produce a multiplied clock signal while controlling the phase relationship between the clock signal and the multiplied clock signal, said method comprising the steps of:

comparing phase of a clock signal and a comparison clock signal in a phase comparator and outputting a first signal indicating whether the clock signal leads or lags the comparison clock signal, shifting a predetermined bit within an up/down shift register in a direction corresponding to a phase difference between the clock signal and the comparison clock signal, activating a selected portion of a plurality of discrete fixed delay elements in response to a position of the predetermined bit in the up/down shift register to selectively delay the clock signal by an amount proportional to the number of activated fixed delay elements to produce a delayed clock signal, generating the comparison clock signal from the delayed clock signal, and generating a multiple clock signal having a frequency multiple of the clock signal having a predetermined phase relationship with the clock signal, wherein the step of generating a multiple clock signal having a frequency multiple of the clock signal having a predetermined phase relationship with the clock signal further comprises the steps of:

receiving in a plurality of pulse generating circuits, each coupled to a corresponding one of said plurality of fixed delay elements, a corresponding delay signal, producing, in the plurality of pulse generating circuits, a corresponding pulse at a predetermined edge of the corresponding delay signal, and generating a multiple clock signal, wherein an edge of the multiple clock signal is generated from a corresponding pulse from one of the plurality of pulse generating circuits.

6. The method of claim 5, wherein the step of generating the comparison clock signal comprises the step of:

dividing the multiple clock signal to generate the comparison clock signal.

7. A method for controlling phase relationship of two clock signals comprising the steps of:

comparing phase of a clock signal and a comparison clock signal in a phase comparator and outputting a first signal indicating whether the clock signal leads the comparison clock signal, and a second signal indicating whether the clock signal lags the comparison clock signal, shifting a predetermined bit within an up/down shift register in a direction corresponding to a phase difference between the clock signal and the comparison clock signal in response to the first and second signals, activating a selected portion of a plurality of discrete fixed delay elements in response to a position of the predetermined bit in the up/down shift register to selectively delay the clock signal by an amount proportional to the number of activated fixed delay elements to produce a delayed clock signal, and generating the comparison clock signal from the delayed clock signal, wherein the step of comparing phase further comprises the step of:

setting initial conditions of the phase comparator at reset, wherein said step of setting initial conditions of the phase comparator at reset comprises the steps of:

generating, from a reset signal and the clock signal, an initial condition reset signal pulse having a predetermined period, and forcing portions of the phase comparator to predetermined logic levels during the initial condition reset signal pulse period.

8. The method of claim 7, wherein said up/down shift register comprises a plurality of up/down shift registers coupled in series, and the step of shifting a predetermined bit within an up/down shift register comprises the steps of:

storing a first bit in a master flip-flop, outputting the first bit from the master flip-flop when the first signal is received, receiving, in a slave flip-flop coupled to the master flip-flop the first bit from the master flip-flop, and outputting a second bit from the slave flip-flop when a delayed first signal is received.

9. A clock doubling circuit comprising:

a phase comparator for comparing phase of a clock signal and a comparison clock signal derived from a doubled clock signal and outputting a first signal indicating whether the clock signal leads or lags the comparison clock signal;

up/down shift register, coupled to the phase comparator, for receiving the first signal and shifting a predetermined bit within the up/down shift register in a direction corresponding to a phase difference between the clock signal and the comparison clock signal;

a variable delay line, coupled to the up/down shift register and receiving the clock signal, said variable delay line comprising a plurality of discrete fixed delay elements, each of the plurality of discrete delay elements being activated and deactivated in response to a position of the predetermined bit in the up/down shift register for selectively delaying the clock signal by an amount proportional to the number of activated fixed delay elements to produce a delayed clock signal;

a clock doubler, coupled to the variable delay line, for generating the doubled clock signal in a predetermined phase relationship with the clock signal; and means, coupled to the clock doubler, for receiving the doubled clock signal and generating the comparison clock signal;

a plurality of pulse generating circuits, each coupled to a corresponding one of said plurality of delay segments, for receiving a corresponding delay signal and producing a corresponding pulse at a predetermined edge of the corresponding delay signal; and a clock generator circuit, coupled to the plurality of pulse generating circuits, for generating the double clock signal, wherein an edge of the double clock signal is generated from a corresponding pulse from one of the plurality of pulse generating circuits.

10. The clock doubling circuit of claim 9, wherein said means for receiving the delayed clock signal and generating the comparison clock signal comprises:

a divider, coupled to the clock doubler and the phase comparator, for dividing the double clock signal to generate the comparison clock signal.

11. A clock doubling circuit comprising:

a phase comparator for comparing phase of a clock signal and a comparison clock signal derived from a doubled clock signal and outputting a first signal indicating whether the clock signal leads the comparison clock signal and a second signal indicating whether the clock signal lags the comparison clock signal;

up/down shift register, coupled to the chase comparator, for receiving the first signal and the second signal and shifting a predetermined bit within the up/down shift register in a direction corresponding to a phase difference between the clock signal and the comparison clock signal;

a variable delay line, coupled to the up/down shift register and receiving the clock signal, said variable delay line comprising a plurality of discrete fixed delay elements, each of the plurality of discrete delay elements being activated and deactivated in response to a position of the predetermined bit in the up/down shift register for selectively delaying the clock signal by an amount proportional to the number of activated fixed delay elements to produce a delayed clock signal;

a clock doubler, coupled to the variable delay line, for generating the doubled clock signal in a predetermined phase relationship with the clock signal; and means, coupled to the clock doubler, for receiving the doubled clock signal and generating the comparison clock signal, wherein said phase comparator further comprises:
means for setting initial conditions of the phase comparator at reset, wherein said means for setting initial conditions of the phase comparator at reset comprises:
means for receiving a reset signal and the clock signal and for generating an initial condition reset signal pulse having a predetermined period; and means, coupled to said phase comparator, for forcing portions of said phase comparator at predetermined logic levels during the initial condition reset signal pulse period.

12. The clock doubling circuit of claim 11, wherein said up/down shift register comprises a plurality of up/down shift registers coupled in series, each of said plurality of up/down shift registers comprising:

a master flip-flop for storing a first bit and for outputting the first bit to when the first signal is received; and a slave flip-flop, coupled to the master flip-flop, for receiving the first bit from the master flip-flop and outputting a second bit when a delayed first signal is received.

* * * * *